United States Patent [19]

Nakamura et al.

[11] Patent Number: 5,016,564
[45] Date of Patent: May 21, 1991

[54] PLASMA APPARATUS

[75] Inventors: Seiichi Nakamura; Satoshi Nakayama; Takashi Inoue, all of Amagasaki, Japan

[73] Assignee: Sumitomo Metal Industries Ltd., Osaka, Japan

[21] Appl. No.: 414,511

[22] Filed: Sep. 29, 1989

Related U.S. Application Data

[60] Division of Ser. No. 364,585, Jun. 12, 1989, which is a continuation of Ser. No. 137,052, Dec. 23, 1987, abandoned.

[30] Foreign Application Priority Data

| Dec. 29, 1986 | [JP] | Japan | 61-309560 |
| Jun. 30, 1987 | [JP] | Japan | 62-164981 |
| Jun. 30, 1987 | [JP] | Japan | 62-164982 |
| Jul. 31, 1987 | [JP] | Japan | 62-193542 |
| Sep. 16, 1987 | [JP] | Japan | 62-231343 |

[51] Int. Cl.$^5$ .............................................. C23C 16/48
[52] U.S. Cl. ........................................ 118/723; 427/39; 422/186.05; 156/345
[58] Field of Search ............. 427/39; 118/723; 204/298.19; 422/186.05; 156/345

[56] References Cited

U.S. PATENT DOCUMENTS

| 4,369,205 | 1/1983 | Winterling | 427/39 |
| 4,401,054 | 8/1983 | Matsuo | 427/47 |

FOREIGN PATENT DOCUMENTS

| 56-155535 | 12/1981 | Japan . | |
| 0056036 | 4/1982 | Japan . | |
| 0154620 | 8/1985 | Japan . | |
| 0218826 | 11/1985 | Japan . | |
| 0026597 | 2/1986 | Japan | 427/47 |
| 0087868 | 5/1986 | Japan . | |
| 087884 | 5/1986 | Japan . | |
| 125133 | 6/1986 | Japan . | |
| 135126 | 6/1986 | Japan . | |
| 172334 | 8/1986 | Japan . | |
| 181534 | 8/1986 | Japan . | |
| 213377 | 9/1986 | Japan . | |

OTHER PUBLICATIONS

Vossen, *Thin Film Processes*, Academic Press, N.Y. 1978, pp. 131–136.

*Primary Examiner*—Richard Bueker
*Attorney, Agent, or Firm*—Burns, Doane, Swecker & Mathis

[57] ABSTRACT

The present invention relates to a plasma apparatus, in which a plasma is generated by the use of an electron cyclotron resonance, said plasma being introduced into a sample chamber where a sample is housed through a plasma outlet window by the use of a magnetic field for use in the electron cyclotron resonance, and said sample being subjected to a film-formation or an etching, characterized by that the distribution of magnetic flux density on a surface of the sample can be improved to uniform the plasma density, whereby subjecting the sample with the film-formation of uniformly thick or a uniform etching, by disposing a magnetic field forming means capable of forming a magnetic field, wherein the magnetic flux density at the peripheral edge portion of the sample is higher than that at the central portion of the sample, on a side opposite to the plasma outlet window relatively to the sample.

1 Claim, 18 Drawing Sheets

PLASMA APPARATUS

This application is a divisional of application Ser. No. 07/364,585, filed Jun. 12, 1989, which is a continuation of application Ser. No. 07/137,052, filed Dec. 23, 1987, abondoned.

BACKGROUND OF THE INVENTION

1. Field of the Invention

The present invention relates to a plasma apparatus used as a CVD (Chemical Vapor Deposition) apparatus, an etching apparatus and the like.

2. Description of the Prior Art

Since a plasma apparatus utilizing an electron cyclotron resonance can form a plasma having a high activity at a low gas pressure and bring out a plasma flow having a large diameter, it can be applied to the formation of a thin film, etching and the like in a highly integrated semi-conductor element and the like. And, its investigation and development are progressing.

FIG. 1 is a longitudinal sectional view showing a conventional plasma apparatus constructed as a thin film forming apparatus. Reference numeral 31 designates a plasma chamber. Said plasma chamber 31 is provided with a microwave inlet 31c sealed up with a silica glass plate 31b at a center of an upper wall thereof and a plasma outlet window 31d at a position opposite to said microwave inlet 31c at a center of a lower wall thereof, said microwave inlet 31c being connected with one end of a wave guide 32, which is connected with a microwave generator (not shown) at the other end, a sample chamber 33 being arranged so as to face to the plasma outlet window 31d, and an exciting coil 34 being arranged concentrically with said sample chamber 33 so as to surround from the plasma chamber 31 to one end portion of the wave guide 32 connected with the plasma chamber 31.

The sample chamber 33 is provided with a sample stage 35 arranged at a position opposite to the plasma outlet window 31d, a sample 100, such as a disc wafer, being placed on the sample stage 35 as it is or detachably by means of a static absorption and the like, and the sample chamber 33 being provided with an exhaust port 33a, which is connected with an exhauster (not shown), opened at a lower wall thereof. In addition, reference numerals 31g, 33g designate material gas supply pipes, reference numeral 31e designating a water-supply system of a cooling water, and reference numeral 31f designating a drain system of the cooling water.

With such a thin film forming apparatus, the plasma chamber 31 and the sample chamber 33, which have been set at a desired vacuosity, are supplied with a material gas, a high-frequency electric field due to a microwave being applied in the plasma chamber 31 while forming a magnetic field by the exciting coil 34, to form a plasma, the resulting plasma being led out to the vicinity of the sample 100 on the sample stage 35 within the sample chamber 33 from the plasma chamber 31 through the plasma outlet window 31d by a divergent magnetic field formed by the exciting coil 34, and a surface reaction due to ions and radical particles in the plasma flow being brought on a surface of the sample 100 to form a film on the surface of the sample 100 (Japanese Patent Application Laid-Open No. 155535/1981).

However, with such the conventional plasma apparatus, the plasma brought about in the plasma chamber 31 is extracted to a side of the sample 100 within the sample chamber 33 through the plasma outlet window 31d along a line of magnetic force of the divergent magnetic field formed by the exciting coil 34 but the plasma generated in the plasma chamber 31 is not uniform, that is, a plasma density at a central portion of the plasma chamber 31 becomes higher than that at a periphery of the plasma chamber 31. This uneven distribution of plasma density has an enlarged influence upon the sample 100 by the divergent magnetic field as it is. In the case where the sample 100 is arranged in a concentrical manner with the plasma outlet window 31d, a difference occurs between the central portion and the periphery of the sample 100 in deposition rate, whereby making a film thickness uneven.

It is a reason why the uneven distribution of the plasma generated in the plasma chamber 31 is projected toward the sample 100 by the divergent magnetic field as it is that electrons in the plasma take a cyclotron movement (larmor movement) having a cyclotron radius of several tens microns to several hundreds microns around the divergent magnetic field while ions in the plasma follow the electrons by an electric field having an amphoteric polarity generated between them and the electrons, so that the plasma is restricted by the line of magnetic force as a whole.

FIG. 2 is a diagram showing a positional relation between the divergent magnetic field formed by the exciting coil 34 and the sample 100. As obvious from FIG. 2, the line of magnetic force of the divergent magnetic field formed by the exciting coil 34 is expanded as it approaches to the sample 100 through the plasma outlet window 31d, so that the uneven distribution of the plasma generated in the plasma chamber 31 is projected on the sample 100 in an enlarged manner. Accordingly, in the case where a film is deposited, the uneven film thickness can not be avoided.

Such an uneven film thickness or etching depth has been found not only in the thin film forming apparatus but also in the case where it is used as an etching apparatus (Japanese Patent Application Laid-Open No. 47728/1984).

SUMMARY OF THE INVENTION

The present invention was achieved in order to solve the above described problems.

A first object of this invention is to provide a plasma apparatus, in which a magnetic field forming means for forming a magnetic field so that a density of magnetic field at a periphery of a sample may be higher than that at a central portion of the sample is arranged on a side opposite to a plasma outlet window relatively to the sample to make a density of plasma above the sample to be uniform.

A second object of this invention is to provide a plasma apparatus, in which a coil is disposed around a magnetic body as a magnetic forming means to achieve a fine regulation of magnetic flux density.

A third object of this invention is to provide a plasma apparatus, in which a magnetic flux density at a peripheral portion of a sample and that at a central portion of the sample are independently controlled by a magnetic field forming means to easily improve the distribution of magnetic flux density on a surface of the sample.

A fourth object of this invention is to provide a plasma apparatus, in which a magnetic field formed by an exciting coil, a magnetic field of the same direction and a magnetic field of an opposite direction are simultaneously formed by a magnetic field forming means to remarkably increase a magnetic flux density at an appointed position.

A fifth object of this invention is to provide a plasma apparatus, in which a magnetic field forming means comprises exciting coils integrally disposed on an inside circumference and an outside circumference of a cylindrical magnetic body to simplify the magnetic field forming means in construction and form an ideal magnetic field.

A sixth object of this invention is to provide a plasma apparatus, in which a magnetic field forming apparatus comprises a permanent magnet and a magnetic body in combination to make a power supply facility for the magnetic field forming means unnecessary, thereby simplifying construction.

The above and further objects and features of the invention will more fully be apparent from the following detailed description with accompanying drawings.

DESCRIPTION OF THE PREFERRED EMBODIMENTS

The preferred embodiments, in which the present invention is constructed as a thin film forming apparatus, are concretely described below with reference to the drawings.

Figure 3:
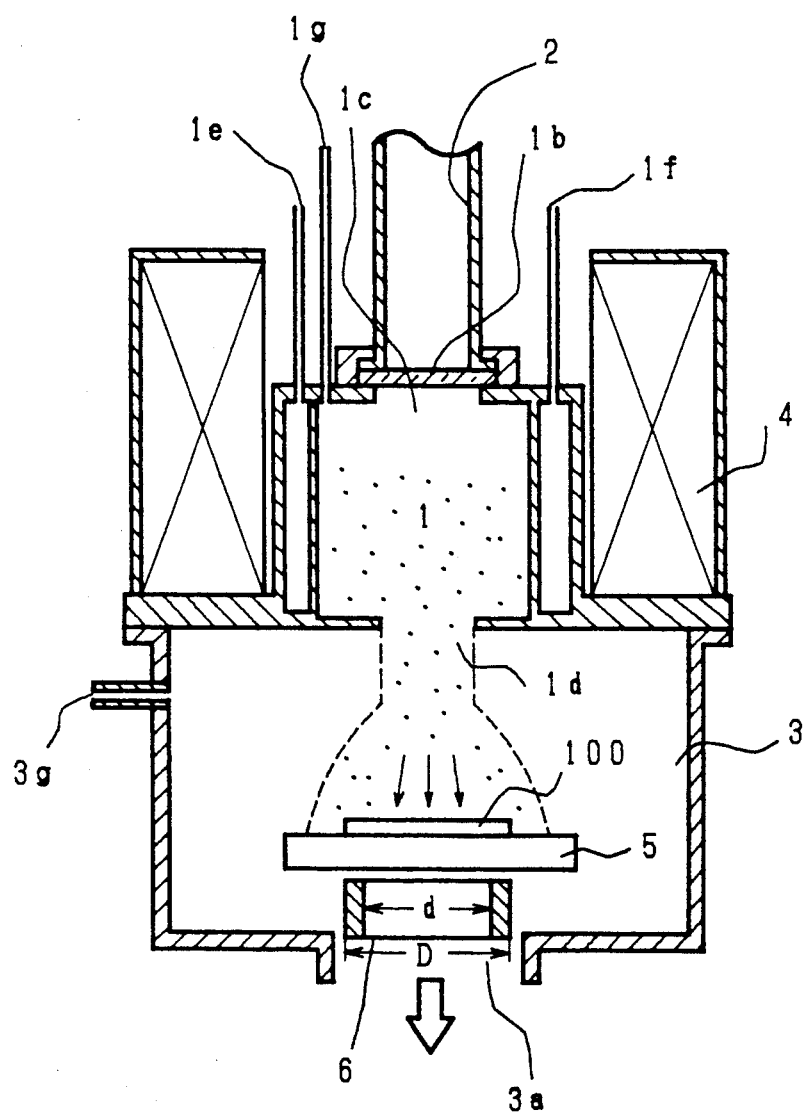
FIG. 3 is a longitudinal sectional view showing a plasma apparatus according to the present invention.

FIG. 3 is a longitudinal sectional view showing a plasma apparatus according to the present invention. Referring to FIG. 3, reference numeral 1 designates a plasma chamber, reference numeral 2 designating a wave guide, reference numeral 3 designating a sample chamber, and reference numeral 4 designating an exciting coil.

The plasma chamber 1 is provided with a microwave inlet 1c closed by a silica glass plate 1b at a center of an upper wall thereof and a circular plasma outlet window 1d at a position opposite to said microwave inlet 1c of a center of a lower wall thereof, said microwave inlet being connected with one end of the wave guide 2, the sample chamber 3 being arranged so as to face to the plasma outlet window 1d, and the exciting coil 4 being arranged around said sample chamber 3 so as to surround from the plasma chamber 1 to one end portion of the wave guide 2 connected with the plasma chamber 1.

The outer end portion of the wave guide 2 is connected with a microwave (not shown) to introduce the microwave into the plasma chamber 1 through the microwave inlet 1c. The exciting coil 4 is connected with a direct current power source (not shown) to form a magnetic field by passing a direct current through the exciting coil 4 so that a plasma may be formed by introducing a microwave into the plasma chamber 1. This magnetic field is a divergent magnetic field with a magnetic flux density reduced toward a side of the sample chamber 3. The plasma formed in the plasma chamber 1 is introduced into the sample chamber 3.

A sample stage 5 is disposed at a position opposite to the plasma outlet window 1d at a center of a lower portion within the sample chamber 3 so that a sample 100, such as a wafer, may be placed on the sample stage 5 as it is or detachably by means of a static adsorption and the like. In addition, an exhaust port 3a connected with an exhauster (not shown) is opened at a bottom wall.

Reference numerals 1g, 3g designate a material gas supply pipe, reference numeral 1e designating a water-supply system of a cooling water, and reference numeral 1f designating a drain system of the cooling water.

And, in a plasma apparatus according to the present invention, a cylindrical magnetic body 6 as the magnetic field forming means is disposed almost concentrically with the plasma outlet window 1d, the sample stage 5 and the sample 100 placed on the sample stage 5 below the sample stage 5. An outside diameter D of this magnetic body 6 is set at a value almost equal to a diameter of the sample 100 or more. In addition, an inside diameter d of this magnetic body is set at a value other than 0, that is to say, so that $0 < d < D$ may be held good.

Figure 4:
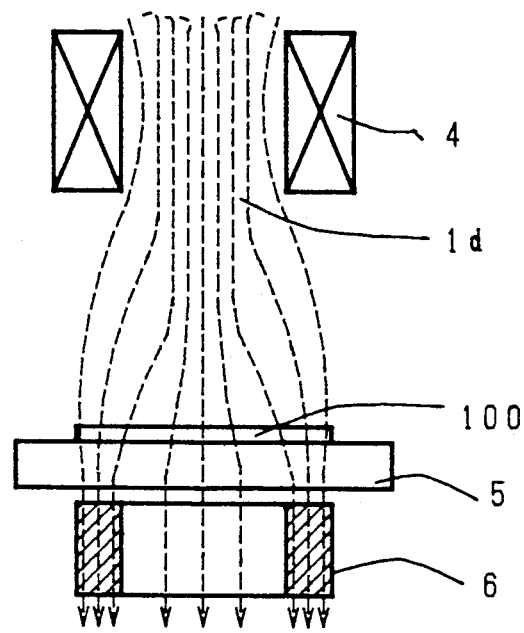
FIG. 4 is a schematic diagram showing lines of magnetic force in a plasma apparatus according to the present invention.

FIG. 4 is a diagram showing a line of magnetic force in the case where the above described discoid sample 100 and the cylindrical magnetic body 6 having the outside diameter D. The line of magnetic force of the divergent magnetic field formed by the exciting coil 4 is drawn toward the magnetic body 6. That is to say, the line of magnetic force expanded outside of the magnetic body 6 is pulled back while the line of magnetic force within the magnetic body 6 is spread outward. As a result, the distribution of density of the plasma drawn out of the plasma chamber 1 on a surface of the sample 100 is made uniform.

The above described will be described below in more detail.

It is important in the present invention that a magnetic field forming means capable of increasing a magnetic flux density at a peripheral portion of a sample in comparison with that at a central portion of the sample, that is, a cylindrical magnetic body 6 in the above described preferred embodiment, is used.

Figure 5:
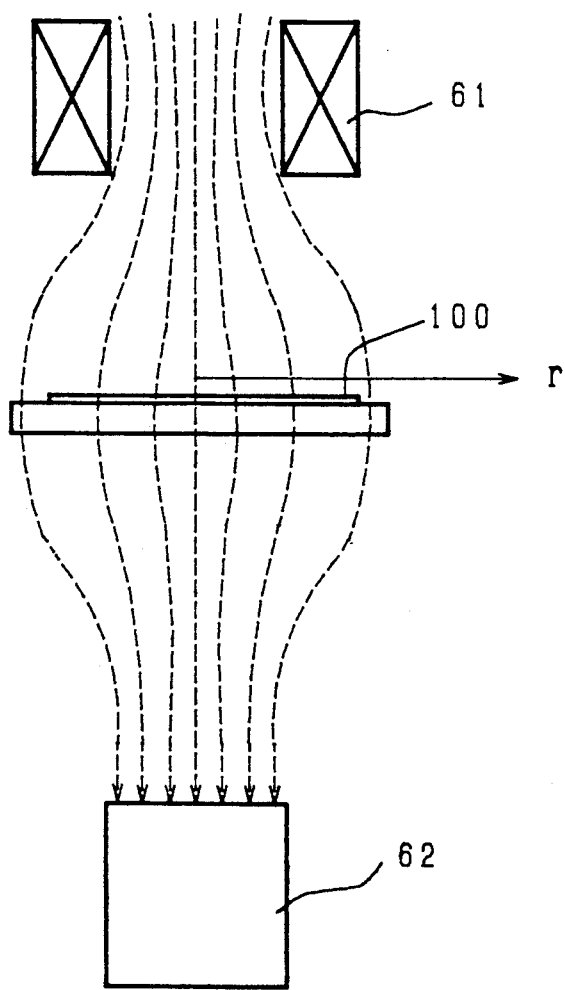
FIG. 5 is a schematic diagram showing a mirror magnetic field.

An etching apparatus, in which a plasma is generated by a microwave and a magnetic field in the same manner as in the present invention, has been disclosed in Japanese Patent Publication No. 13627/1983. A magnet is disposed on a side opposite to a coil for generating the above described magnetic field or a plasma outlet window relatively to a sample to form a mirror magnetic field. FIG. 5 is a schematic diagram showing a line of magnetic force in the case where the mirror magnetic field is formed. Referring to FIG. 5, reference numeral 61 designates a coil for forming a divergent magnetic field and reference numeral 62 designates a magnet for forming the mirror magnetic field. In such the mirror magnetic field, a magnetic flux formed by the coil 61 does not diverge but is converged due to the existence of the magnet 62. However, such conditions cause the magnetic flux density to be higher at the central portion and lower at a peripheral portion. In the case where the sample 100 is placed within this magnetic field, even though the plasma can be economically used, it can not be expected to make uniform the plasma density on the surface of the sample 100.

Figure 6:
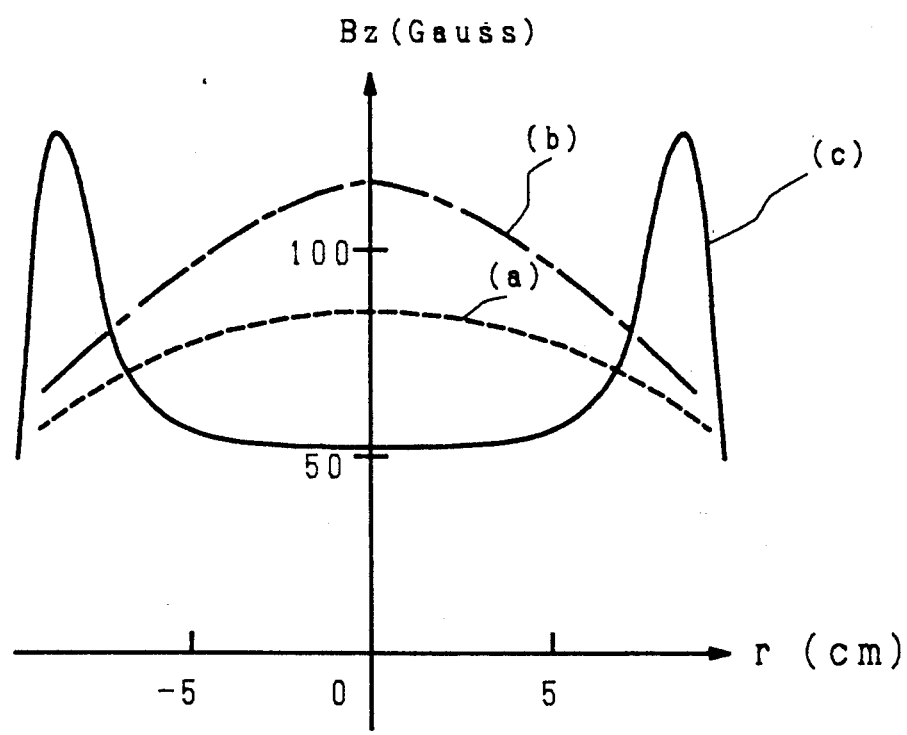
FIG. 6 is a diagram showing the distribution of magnetic flux density in various kinds of magnetic field.

FIG. 6 is a graph showing a relation between a distance r in a radial direction from the center of the sample (refer to FIG. 5) and the distribution of the magnetic flux density Bz, which is a component in the direction vertical to the sample stage at the sample stage 5, for the divergent magnetic field [broken line (a)], mirror magnetic field [one-dotted oblique line (b)] and the magnetic field [full line (c)] obtained by a magnetic field forming means according to the present invention. In FIG. 6, the distance r (cm) from the center of the sample is taken on an axis of abscissa while the vertical component of the magnetic flux density Bz (Gauss) is taken on an axis of the ordinate.

As obvious from FIG. 6, the plasma apparatus according to the present invention can correct the projection of the distribution of plasma density (lower in the peripheral portion) within the plasma chamber as it is in the divergent magnetic field or mirror magnetic field by heightening the peripheral portion of the sample than the central portion of the sample.

In short, in the plasma apparatus according to the present invention, since the magnetic field forming means (magnetic body 6) is disposed on a side opposite to the plasma outlet window 1d relatively to the sample 100, of line of magnetic force of the divergent magnetic field formed toward a side of the sample chamber 3, line of magnetic force in the peripheral portion of the sample 100 or the vicinity thereof are bent in a direction intersecting the peripheral portion of the sample 100, that is, in the inside and outside direction to heighten the magnetic flux density in the peripheral portion of the sample 100, whereby uniforming the distribution of magnetic flux density on the surface of the sample 100. As a result, a thin film having a uniform thickness can be formed on the surface of the sample by using the plasma apparatus according to the present invention.

Figure 1:
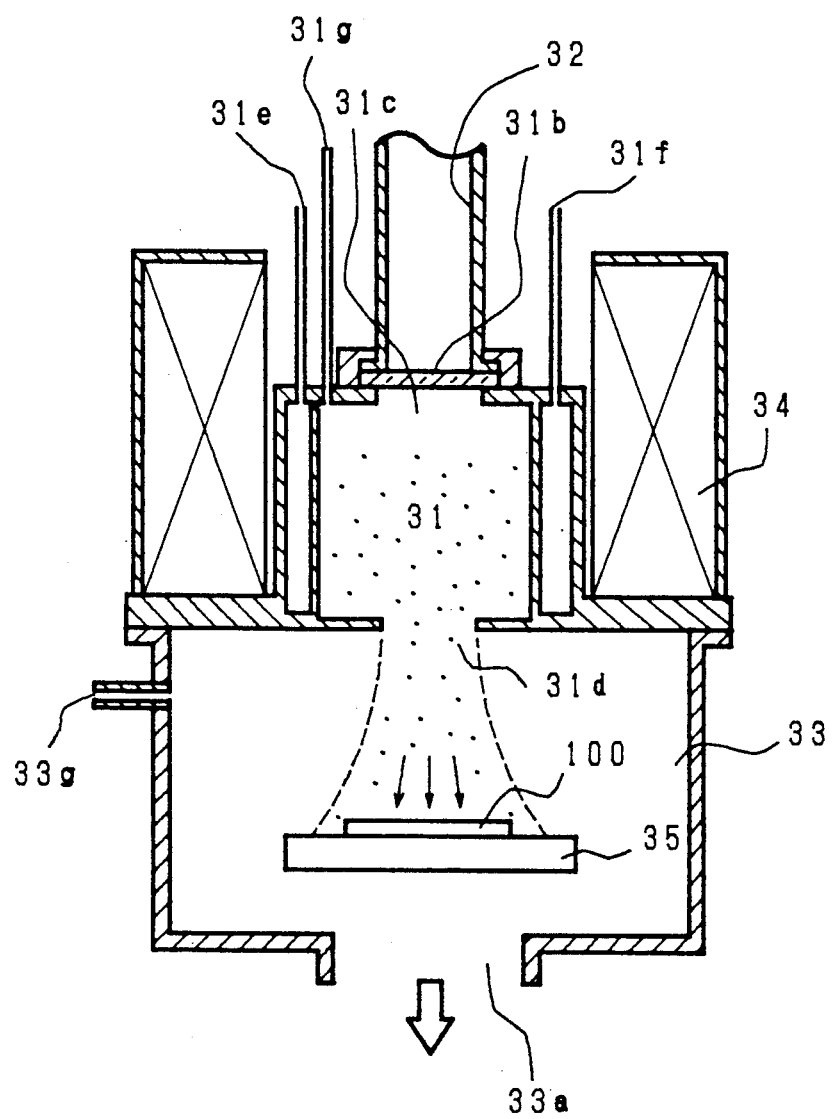
FIG. 1 is a longitudinal sectional view showing the conventional plasma apparatus.
Figure 2:
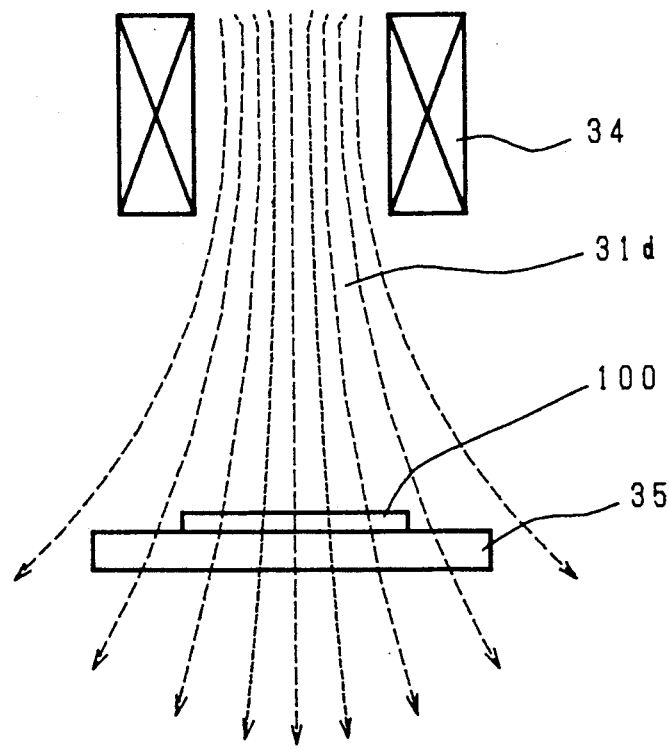
FIG. 2 is a diagram showing a relation between a divergent magnetic field and a sample in the conventional plasma apparatus.

With the above described plasma apparatus according to the present invention and the conventional apparatus shown in FIG. 1, respectively, oxygen gas was introduced into the plasma chamber 1 and SiH$_4$ gas into the sample chamber 3, respectively, as the material gas to generate the plasma and deposit them on a Si wafer having a diameter of 5 inches disposed on the sample stage 5. The umiformity of film thickness was measured with the results that it was ±10% in the conventional apparatus but it was reduced as much as ±5% in the apparatus according to the present invention.

The uniformity of film thickness was determined by the following formula (1):

$$\pm \frac{\text{maximum film thickness} - \text{minimum film thickness}}{\text{maximum film thickness} + \text{minimum film thickness}} \times 100(\%) \quad (1)$$

Figure 7:
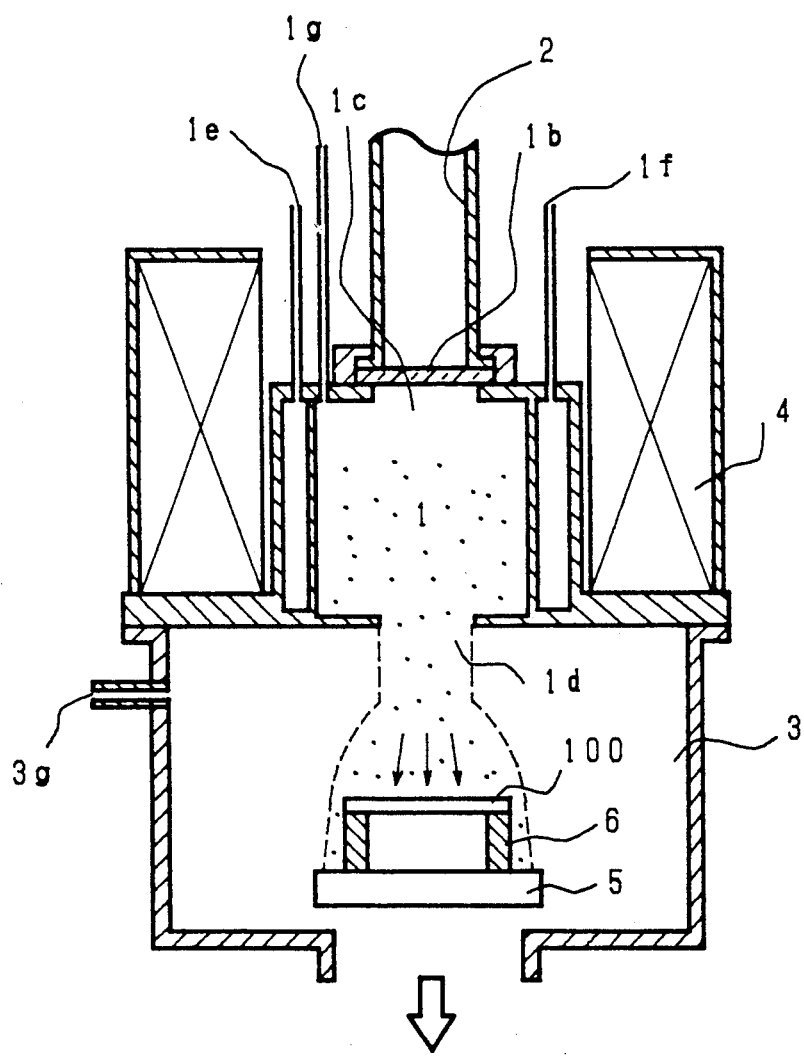
FIGS. 7, 8 are longitudinal sectional views showing another preferred embodiments of a plasma apparatus according to the present invention.
Figure 8:
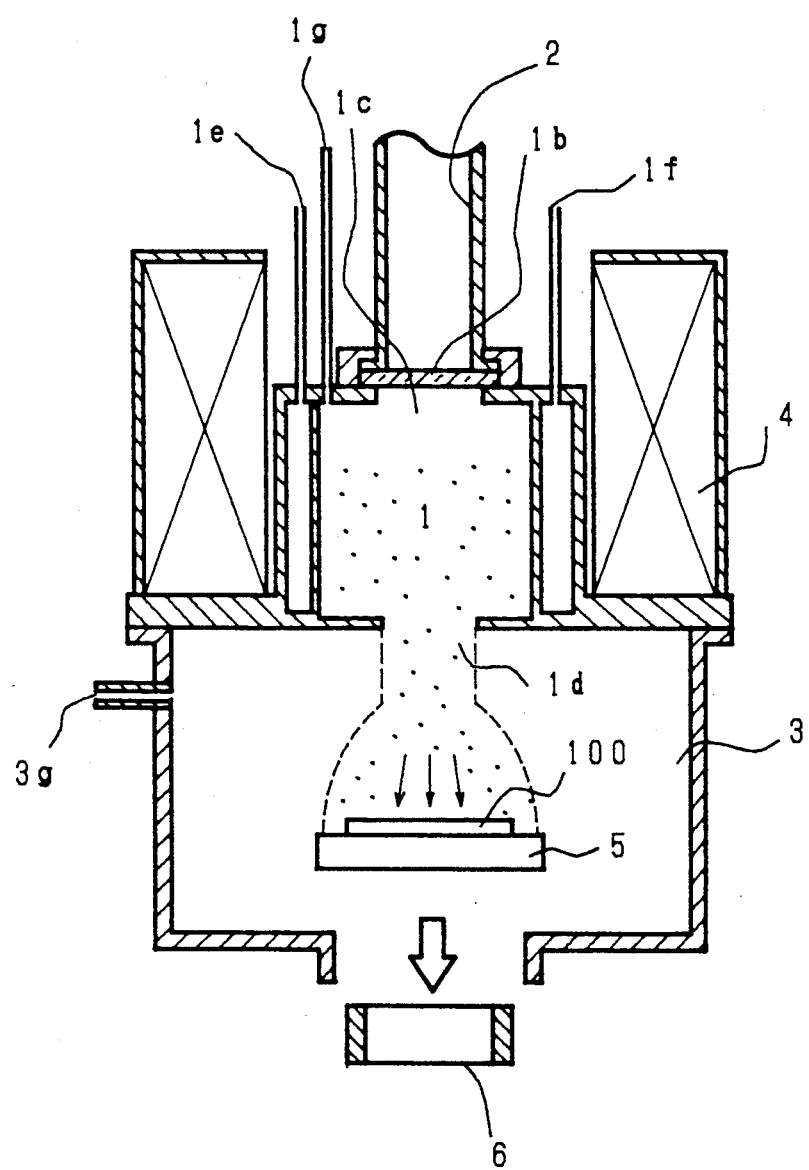

FIGS. 7, 8 are longitudinal sectional view showing another preferred embodiments of the present invention. In these preferred embodiments, the positions of disposing the magnetic body 6 is different from that in the above described preferred embodiment. In the preferred embodiment shown in FIG. 7, the magnetic body 6 is disposed on the sample stage 5 while in the preferred embodiment shown in FIG. 8, the magnetic body 6 is disposed outside of the sample chamber 3.

In addition, the construction other than the magnetic field forming means is same as that shown in FIG. 3, so that its description is omitted here.

Also the construction, in which the magnetic body 6 is integated with the sample stage 5, or the construction, in which the magnetic body 6 serves also as the sample stage 5, can be used in addition to the above described construction.

Figure 9:
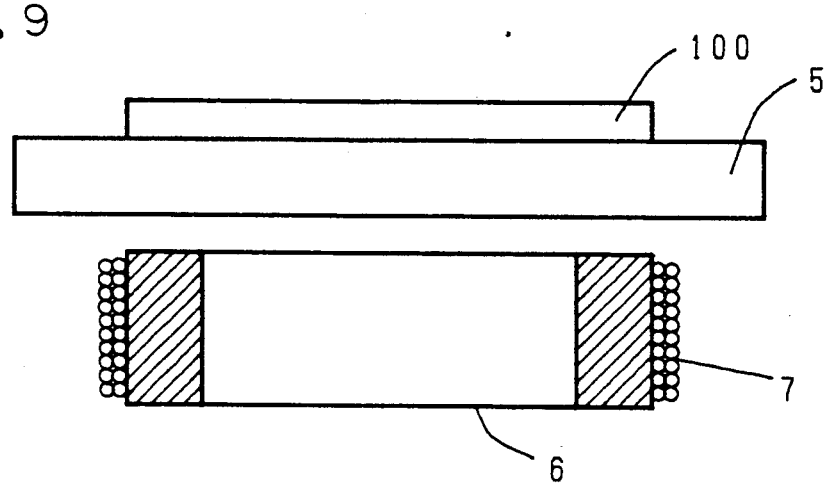
FIG. 9 is a longitudinal sectional view showing another preferred embodiment of a magnetic field forming means in a plasma apparatus according to the present invention.

In addition, FIG. 9 is a sectional view showing another construction of the magnetic field forming means in which a fine electrically conductive wire 7 insulatively coated is densely wound around a cylindrical peripheral surface of the magnetic body 6 many times without forming any gap, a direct current power source (not shown) being connected between end portions of said fine electrically conductive wire 7, and a direct current of a desired magnitude being passed through the fine electrically conductive wire 7 to finely regulate the distribution of magnetic flux density on the surface of the sample 100.

In addition, the fine electrically conductive wire 7 insulatively coated may be disposed around the magnetic body 6 in a circular shape instead of being directly wound around the peripheral surface of the magnetic body 6.

Figure 10:
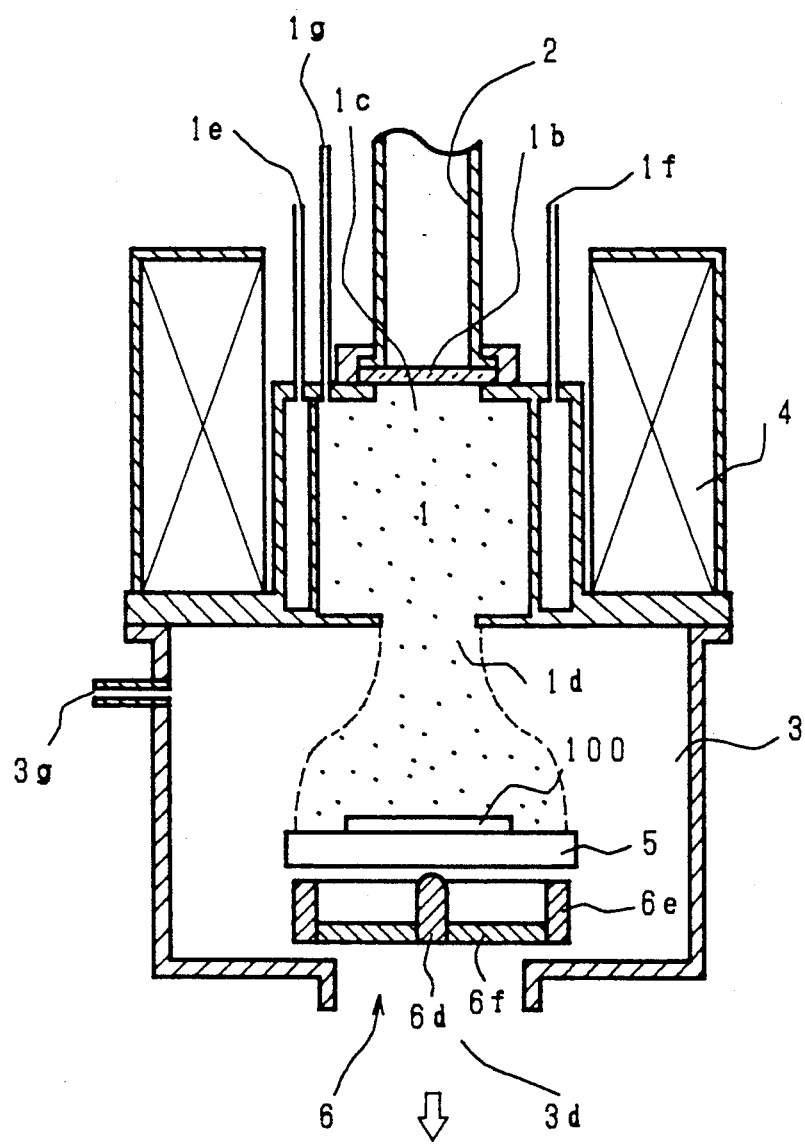
FIG. 10 is a longitudinal sectional view showing another preferred embodiment of a plasma apparatus according to the present invention shown in FIG. 10.

FIG. 10 is a longitudinal sectional view showing another preferred embodiment of the plasma apparatus according to the present invention. In the present preferred embodiment, a magnetic field forming means 6 disposed below a sample stage 5 comprises a permanent magnet and a paramagnetic member in combination. That is to say, in the present preferred embodiment, the magnetic field forming means 6 is provided with a rod-like core 6d made of a paramagnetic material at a center thereof and a circular core 6e made of a paramagnetic material disposed around a periphery of said rod-like core 6d concentrically with it, and a plurality of permanent magnets 6f are disposed in a circular space between the rod-like core 6d and the circular core 6e so that said space may be filled up.

Figure 11:
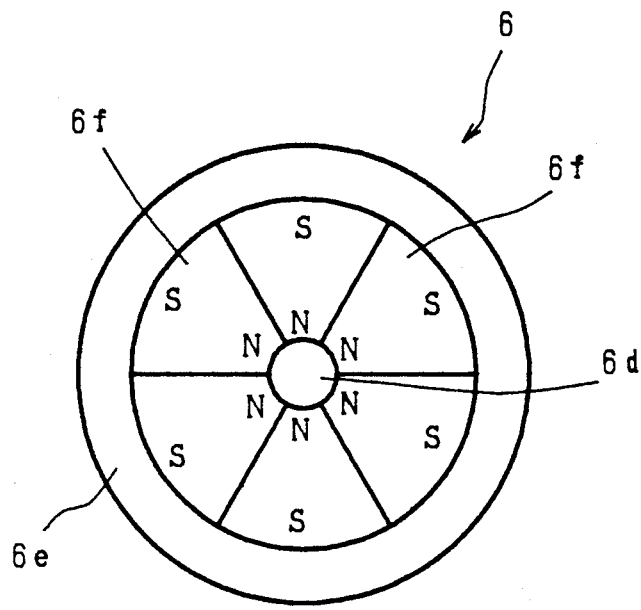
FIG. 11 is a plan view showing a magnetic field forming means in a plasma apparatus according to the present invention shown in FIG. 10.
Figure 12:
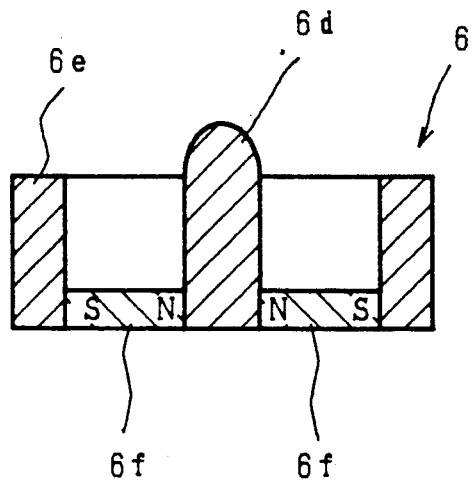
FIG. 12 is a longitudinal sectional view showing a plasma apparatus according to the present invention shown in FIG. 10.

FIG. 11 is a plan view showing the magnetic filed forming means according to the present preferred embodiment and FIG. 12 is a longitudinal sectional view showing the magnetic field forming means 6 according to the present preferred embodiment. Each permanent magnet 6f is fan-shaped. Its central side is a N-pole while its peripheral edge side is a S-pole and a plurality of permanent magnets are arranged in a closely engaged manner under the condition that the N-pole is positioned on a side of the central portion, that is, the rod-like core 6d side, while the S-pole is positioned on a side of the peripheral edge portion, that is, the circular core 6e side.

Materials of the rod-like core 6d, circular core 6e and permanent magnet 6f are not specially limited but the known materials are suitably selected.

In addition, the constructions other than the magnetic field forming means 6 are same as those shown in FIG. 3, so that their description is omitted here.

Figure 13:
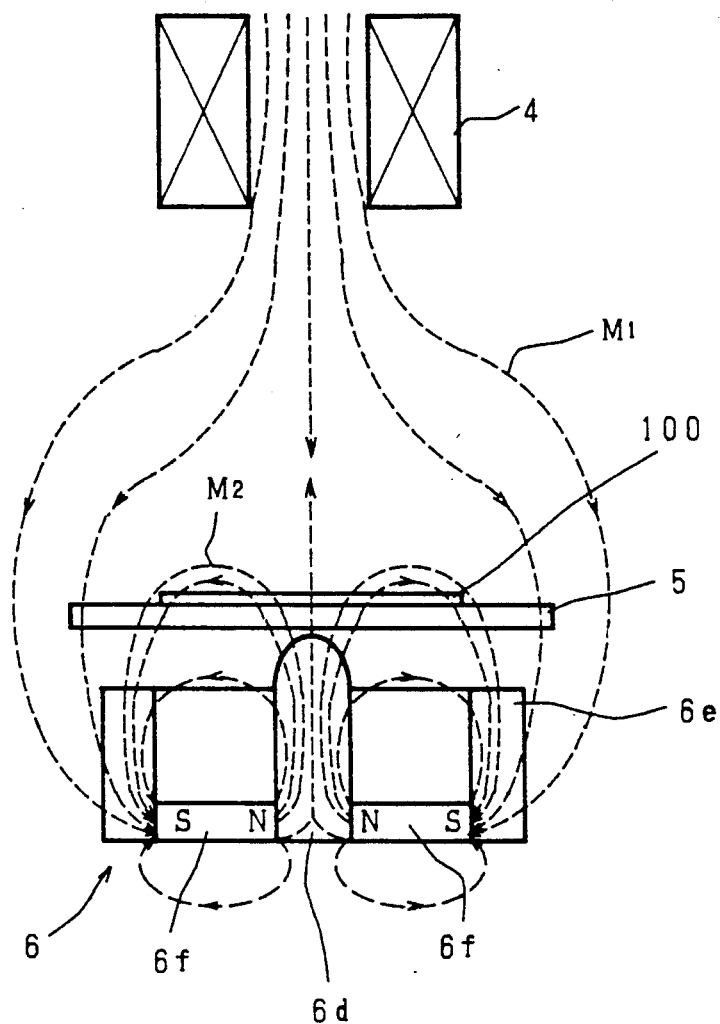
FIG. 13 is a diagram showing the distribution of lines of magnetic force in a plasma apparatus according to the present invention shown in FIG. 10.

FIG. 13 is a diagram showing the distribution of the lines of magnetic force formed by the exciting coil 4 and the magnetic field forming means 6, in which the line of magnetic force $M_1$ forming a divergent magnetic field turning toward a side of the sample chamber 3 formed by the exciting coil 4 is formed so as to pass the positions closer to the peripheral edge portion of the sample stage 5 while almost of the magnetic force $M_2$ of the magnetic field formed by the permanent magnets 6f of the magnetic field forming means 6 is formed so as to turn toward the side of the peripheral edge portion of the sample stage 5 from the central portion of the sample stage 5 through the rod-like core 6d from the N-pole on the side of the central portion and then arrive at the S-pole on the side of the peripheral edge portion through the circular coil 6e from the peripheral edge portion. The line of magnetic force immediately arriving at the S-pole from the N-pole of the permanent magnet 6f without passing through the coils 6d, 6e is remarkably reduced.

Accordingly, the magnetic flux density in the peripheral portion of the sample 100 is relatively heightened while the magnetic flux density at the control portion of the sample 100 is relatively lowered by the existence of the magnetic field forming means 6.

Figure 14:
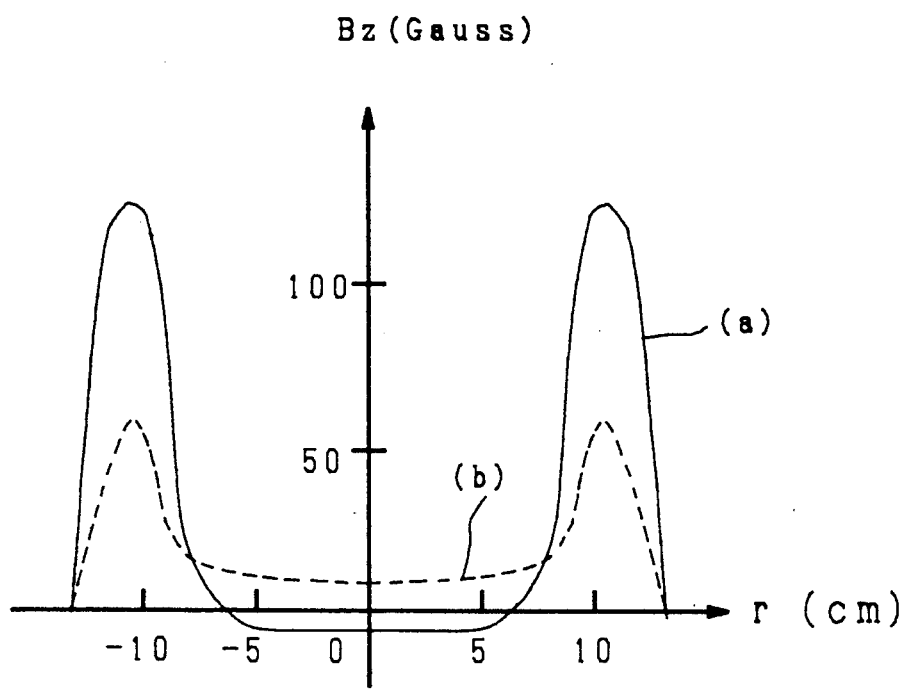
FIG. 14 is a diagram showing the distribution of magnetic flux density on a surface of a sample in a plasma apparatus according to the present invention shown in FIG. 10.

FIG. 14 is a graph showing a relation between a distance r (cm) in the radial direction from the center of the sample and a vertical component of the magnetic flux density Bz (Gauss) in the plasma apparatus according to the present preferred embodiment shown in FIG. 10. Referring to FIG. 14 a full line (a) shows the distribution of density on the surface of the sample stage 5 while a broken line (b) shows the distribution of density at a distance of 1 cm above the surface of the sample stage 5.

It is obvious from FIG. 14 that the condition that the magnetic field forming means 6 is not disposed, that is, the combination of a distribution pattern of magnetic flux density formed by the divergent magnetic filed generated by the exciting coil 4 and the distribution of magnetic flux density formed by the magnetic field forming means 6, leads to the possibility of obtaining a magnetic field in which the magnetic flux density at the peripheral edge portion of the sample 100 is sufficiently higher than that at the central portion of the sample 100. Thus, the plasma density on the surface of the sample 100 can be uniformed.

In this preferred embodiment, since the magnetic field forming means comprises the permanent magnets and the paramagnetic member in combination, no power supply facility is required, whereby the magnetic flux density on the surface of the sample can be uniformed in a simple construction.

With the preferred embodiment shown in FIG. 10 and the conventional apparatus shown in FIG. 1, a silicon wafer having a diameter of 6 inches was placed on the sample stage 5 concentrically with the sample stage 5 and $SiH_4$ gas was introduced into the sample chamber 3 at a flow rate of 28 sccm while $N_2$ gas was introduced into the sample chamber at a flow rate of 35 sccm to form a silicon oxide film on the silicon wafer at a microwave power of 600 W. As a result, the deposition rate of 2100 Å/min and the uniformity of film thickness was ±3.5% were obtained. On the contrary, with the conventional apparatus, the deposition rate was 2100 Å/min and the uniformity of film thickness was ±20%. The uniformity of film thickness was calculated by the above described formula (1).

Figure 15:
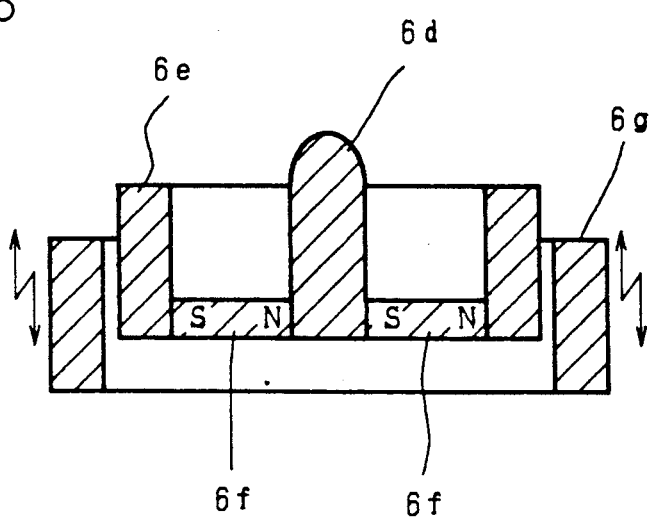
FIG. 15 is a longitudinal sectional view showing another preferred embodiment of a magnetic field forming means in a plasma apparatus according to the present invention.

FIG. 15 is an enlarged longitudinal sectional view showing a modification of the magnetic field forming means 6 according to the preferred embodiment shown in FIG. 10. The periphery of the magnetic field forming means 6 shown in FIGS. 11, 12 is surrounded by a second circular core 6g made of a paramagnetic material disposed concentrically with a circular core 6e of the magnetic field forming means 6 made of a paramagnetic material likewise and this second circular core 6g is movable in the direction of an axis shaft line thereof, in other words, in the direction of approaching to and going away from the sample stage 5.

In addition, an assembly comprising a rod-like core 6d, circular core 6e and permanent magnets 6f may be integrally ascended and descended instead of moving the second circular core 6g.

In such the preferred embodiment, the distribution of magnetic flux immediately above the surface of the sample stage 5 or still further above there can be regulated to still further uniform the plasma distribution in the vicinity of the surface of the sample 100.

Figure 16:
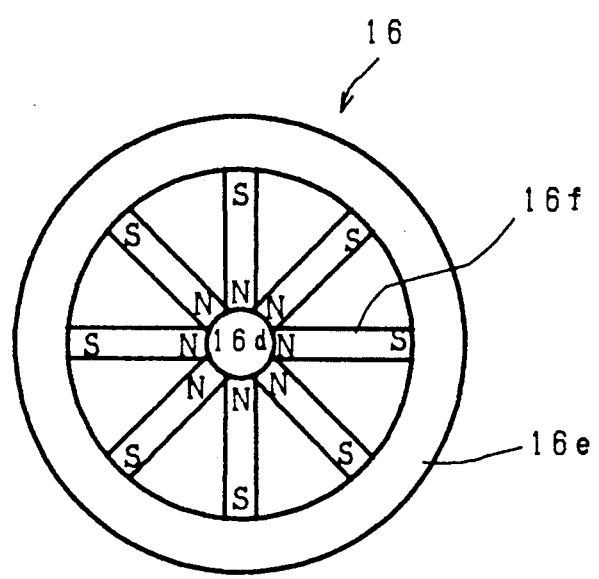
FIG. 16 is a plan view of another preferred embodiment of a magnetic field forming means in a plasma apparatus according to the present invention.
Figure 17:
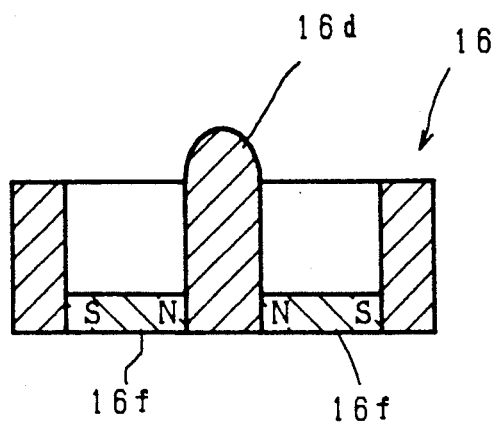
FIG. 17 is a longitudinal sectional view showing a magnetic field forming means shown in FIG. 16.
Figure 18:
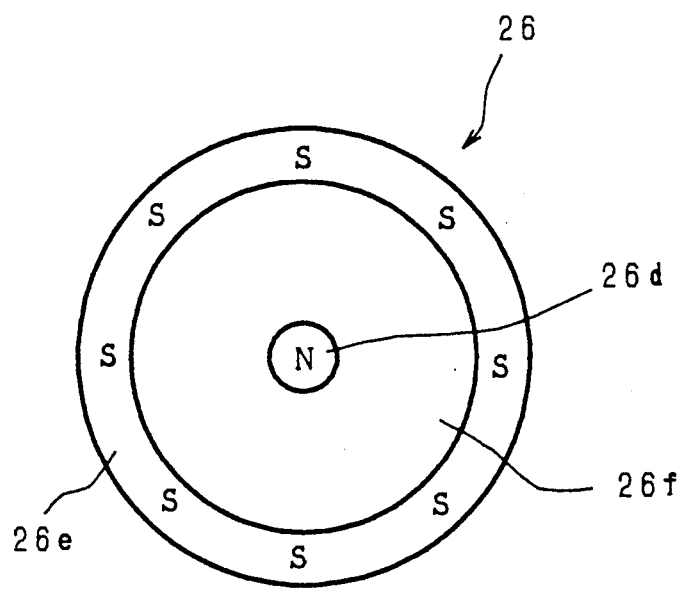
FIG. 18 is a plan view showing another preferred embodiment of a magnetic field forming means in a plasma apparatus according to the present invention.
Figure 19:
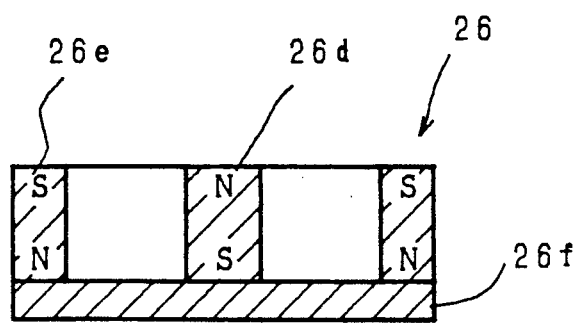
FIG. 19 is a longitudinal sectional view showing a magnetic field forming means shown in FIG. 28.
Figure 20:
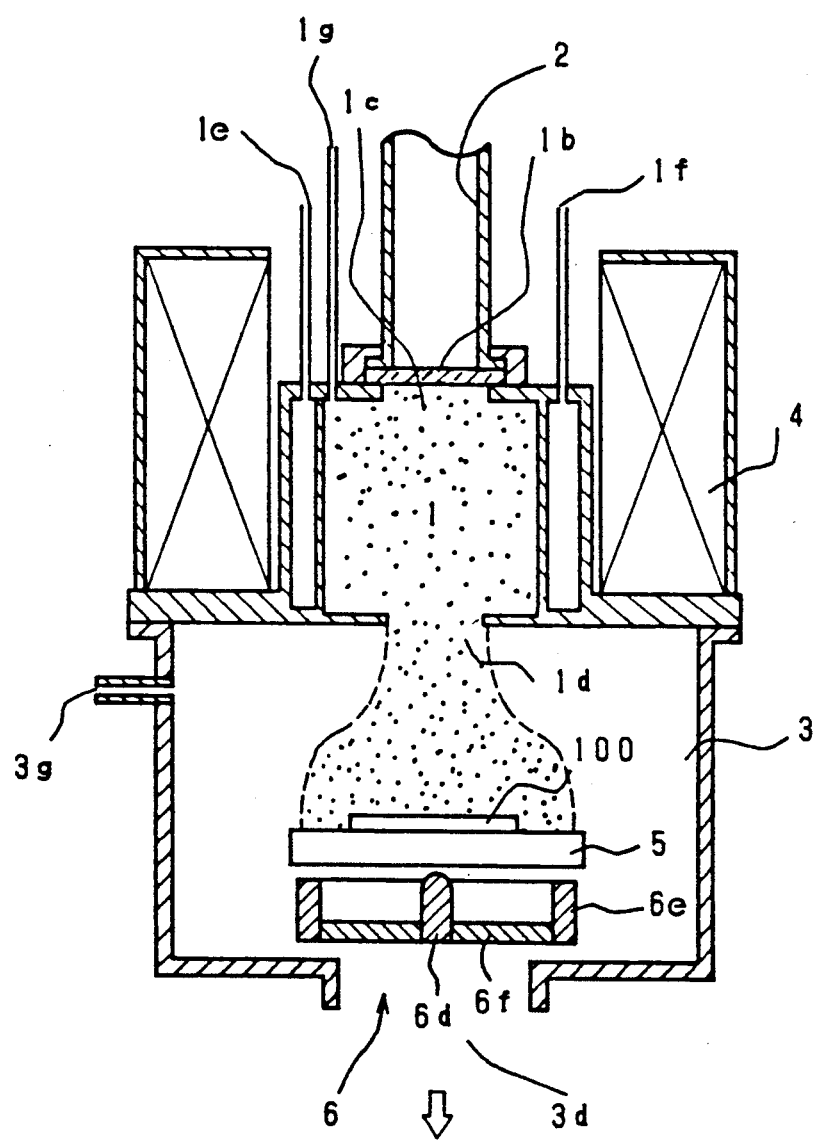
Figure 21:
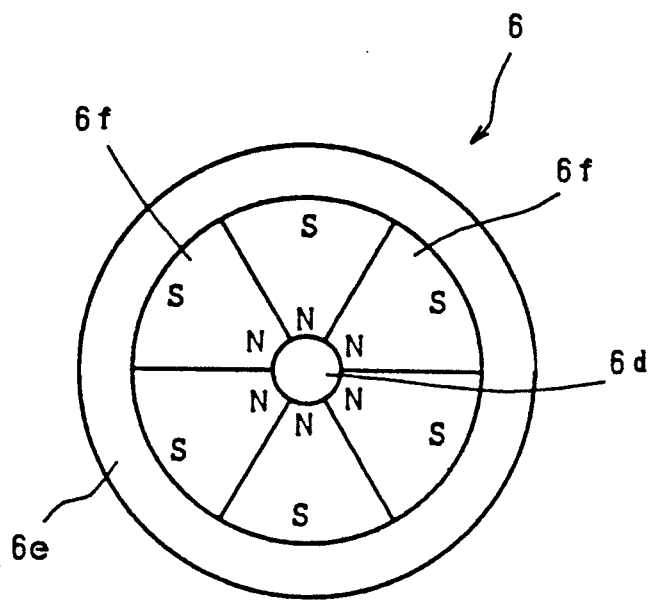
Figure 22:
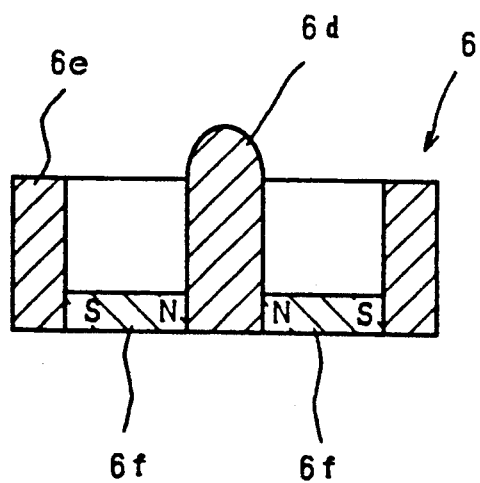
Figure 23:
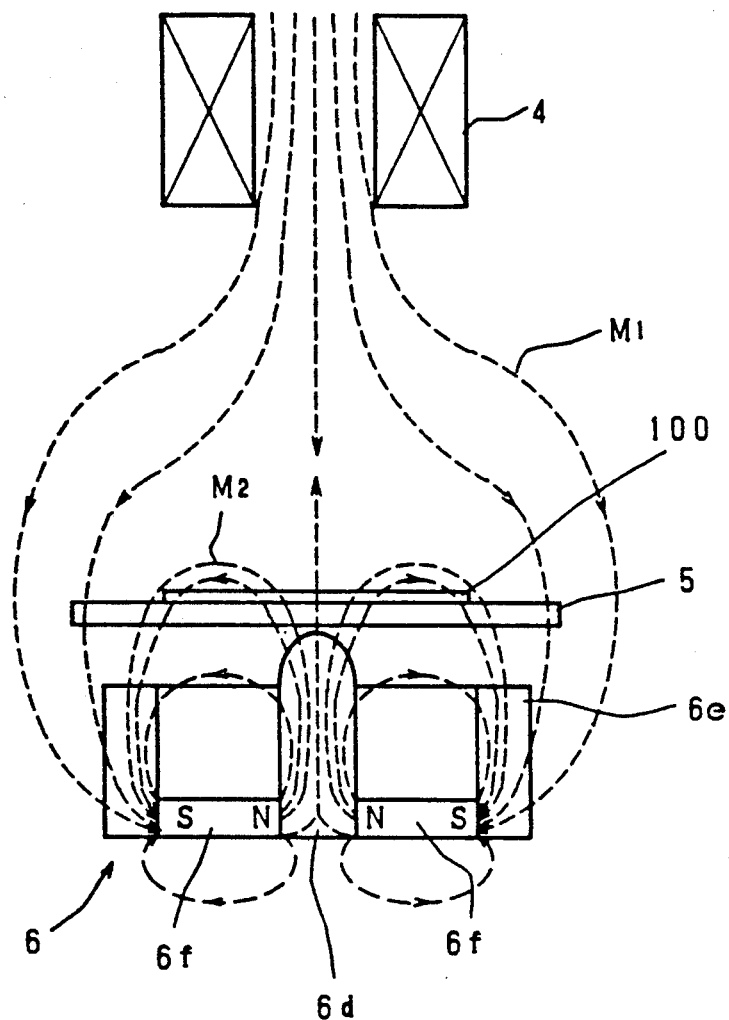
Figure 25:
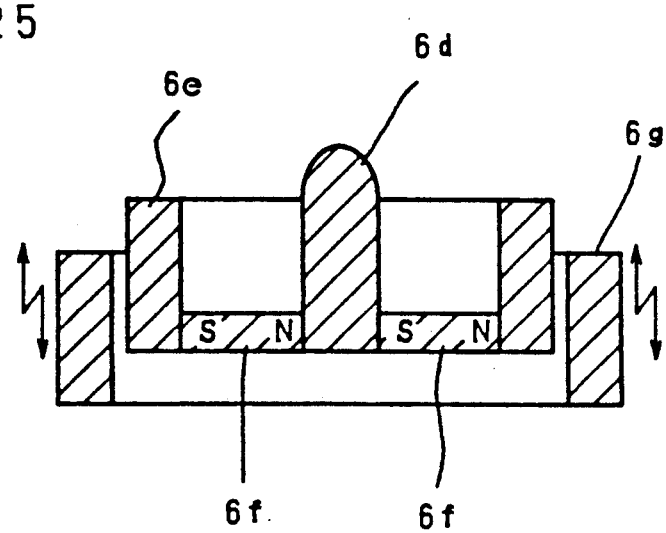
Figure 24:
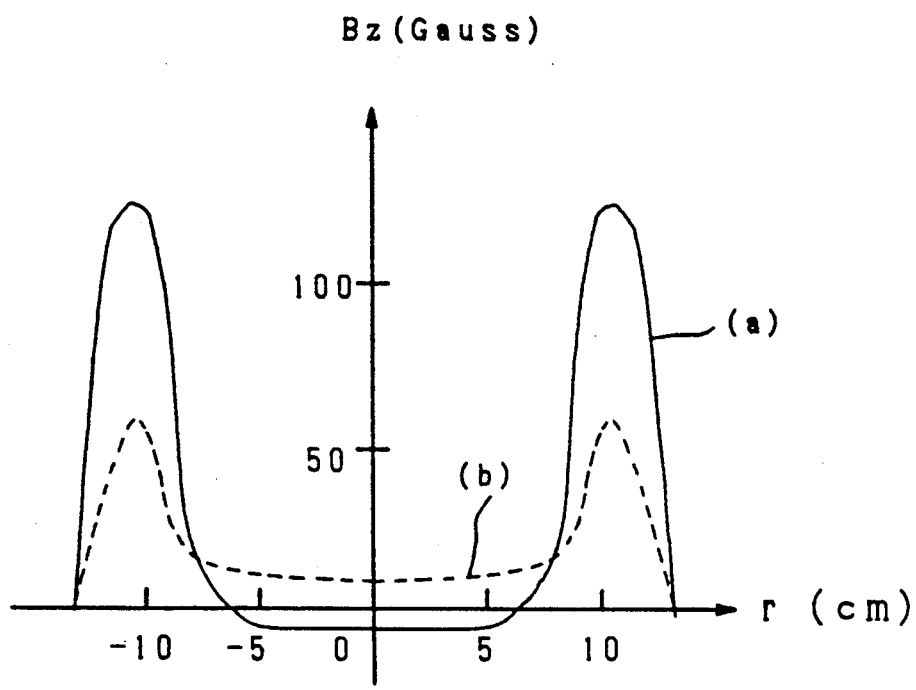
Figure 26:
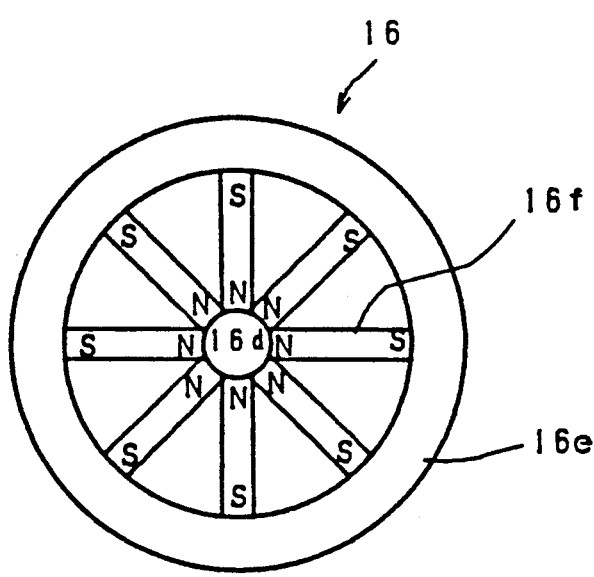
Figure 27:
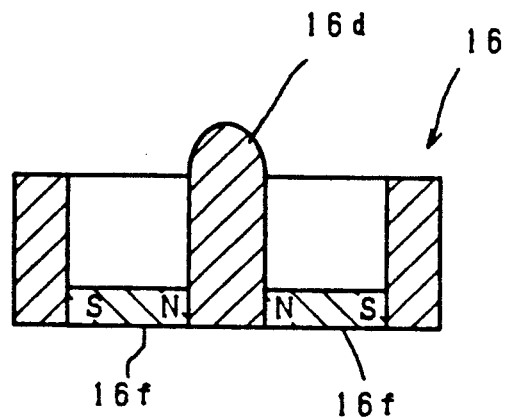
Figure 28:
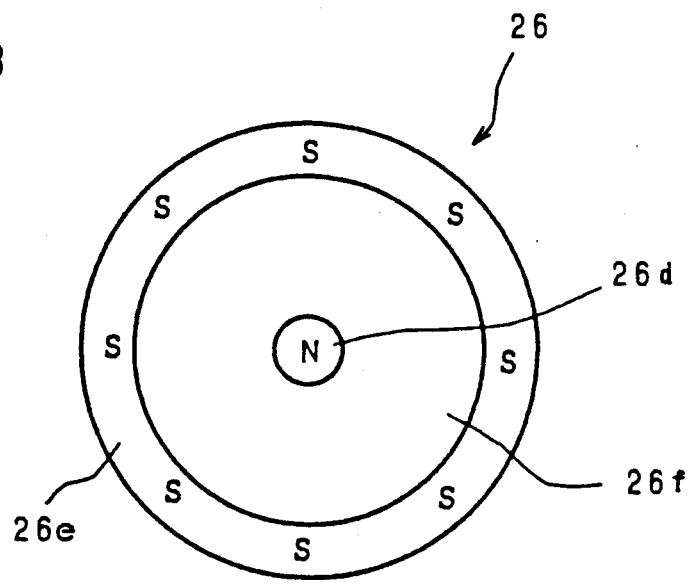
Figure 29:
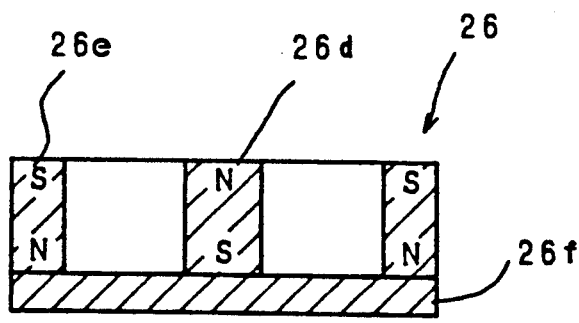

In addition, other constructions and operations shown in FIG. 15 are substantially same as those in the FIGS. 11, 12 and corresponding parts are marked with the same numerals, so that their description is omitted FIGS. 16, 17 and FIGS. 18, 19 show the modifications of the magnetic field forming means according to the preferred embodiment shown in FIG. 10. FIGS. 16, 18 are plan views showing each magnetic field forming means while FIGS. 17, 19 are longitudinal sectional views showing each magnetic field forming means.

The magnetic filed forming means 16 shown in FIGS. 16, 17 comprises rod-like permanent magnets 16f disposed radially in the circumferential direction at almost regular angular intervals between the rod-like core 16d and the circular core 16e made of a paramagnetic material with positioning the N-pole thereof on the central side and the S-pole thereof on a side of the peripheral edge portion.

In such the preferred embodiment, an advantage occurs in that the permanent magnet 16f itself is simplified in construction.

The magnetic field forming means 26 shown in FIGS. 18, 19 comprises a rod-like permanent magnet 26d with a sample stage side as a N-pole and a circular permanent magnet 26e with the sample stage side as a S-pole disposed around said rod-like permanent magnet 26d concentrically with rod-like permanent magnet 26d, said rod-like permanent magnet 26d and said circular permanent magnet 26e being concentrically disposed on a disc core 26f made of a paramagnetic material.

In such the preferred embodiment, the lines of magnetic force are formed toward an upper end as the S-pole of the circular permanent magnet 26e from an upper end as the N-pole of the rod-like permanent magnet 26d positioned at the center and the plasma moved along the direction of the lines of magnetic force is dispersed from a side of the rod-like permanent magnet 26d to a side of the circular permanent magnet 26e, in other words, from a side of the central portion of the sample stage 5 to a side of the peripheral edge portion, whereby uniforming the plasma distribution. In addition, almost of the lines of magnetic force arriving at the rod-like permanent magnet 26d from the N-pole of the circular permanent magnet 26e pass through the disc core 26f, whereby effectively improving the distribution of magnetic flux density.

In addition, other constructions and operations are substantially same as those shown in FIGS. 11, 12 and corresponding parts are marked with the same numerals, so that their description is omitted.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A plasma apparatus comprising:
   a sample chamber provided with a sample stage for supporting a sample;
   means for introducing plasma into said sample chamber, said introducing means including a plasma outlet window; and
   means, disposed in said sample chamber on a side opposite to the plasma outlet window relative to the sample on said sample stage, for forming a magnetic field, said magnetic field forming means including
   a rod-shaped yoke,
   a circular yoke disposed concentrically with said rod-shaped yoke,
   a plurality of permanent magnets disposed in a space between the rod-shaped yoke and the circular yoke, and
   a second circular yoke disposed concentrically with said circular yoke, the second circular yoke being movable toward and away from the sample stage.

* * * * *